US 6,441,423 B1

United States Patent
Mandelman et al.

(10) Patent No.: US 6,441,423 B1
(45) Date of Patent: Aug. 27, 2002

(54) TRENCH CAPACITOR WITH AN INTRINSICALLY BALANCED FIELD ACROSS THE DIELECTRIC

(75) Inventors: Jack A. Mandelman, Stormville; Rama Divakaruni, Somers, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/584,357

(22) Filed: May 31, 2000

(51) Int. Cl.$^7$ .............................................. H01L 27/108
(52) U.S. Cl. ....................... 257/301; 257/296
(58) Field of Search ................................ 257/296, 308, 257/309, 301, 303, 304, 616; 438/243, 245, 386, 388, 270, 389, 246, 244

(56) References Cited

U.S. PATENT DOCUMENTS

| | | | |
|---|---|---|---|
| 5,245,206 A | | 9/1993 | Chu et al. |
| 5,254,873 A | | 10/1993 | Poon et al. |
| 5,395,786 A | * | 3/1995 | Hsu et al. |
| 6,022,786 A | * | 2/2000 | Franosch et al. |
| 6,180,480 B1 | * | 1/2001 | Economikos et al. |

FOREIGN PATENT DOCUMENTS

EP      0 862 207 A1      9/1998

OTHER PUBLICATIONS

V. Li, et al. "Single Gate 0.15 μm CMOS Devices Fabricated Using RTCVD In–Situ Boron Doped $Si_{1-x}Ge_x$ Gates," 1997 IEDM Tech. Digest, pp. 833–836.
Y Ponomarev, et al., "Gate–Workfunction Engineering Using poly–(si, Ge) for High–Performance 0.18 μm CMOS Technology," 1997 IEDM Tech. Digest, pp. 829–832.
P. Hellberg, et al, "Work Function of Boron–Doped Polycrystalline $Si_xGe_{1-x}$ Films," IEEE EDL, vol. 18, No. 9, Sep. 1997, pp. 456–458.

* cited by examiner

Primary Examiner—Nathan J. Flynn
Assistant Examiner—Kevin Quinto
(74) Attorney, Agent, or Firm—Schmeiser, Olsen & Watts

(57) ABSTRACT

The preferred embodiment of the present invention provides an improved capacitor design that overcomes many of the limitations of the prior art. The preferred embodiment of the present invention uses germanium to adjust the work function of the storage node. Specifically, the addition of germanium modifies the fermi level of the storage node, moving the fermi level towards the conduction band. This modification of the fermi level reduces the difference in conduction band-edge potentials between the storage node and the counter electrode, thus reducing the maximum electric potential seen across the capacitor. In the preferred embodiment, p-type doped silicon germanium is formed in the trench capacitor adjacent to the capacitor dielectric layer. A barrier layer is then formed over the doped silicon germanium, and the remaining storage node area is filled with n+-type polysilicon. The p-type doped silicon germanium adjusts the workfunction of the capacitor storage node, moving the fermi level toward the conduction band. This minimizes the maximum difference between conduction band-edge potentials of the storage node and the buried plate, which serves as the counter electrode. This has the effect of balancing the electric potential seen across the dielectric for stored high and stored low situations. This reduces the maximum electric potential seen across the capacitor dielectric. This solution improves the reliability of the capacitor, especially those capacitors with relatively thin dielectric layers, without requiring additional circuitry to bias the buried plate, and without increasing power consumption. The preferred embodiment also reduces leakage current through the capacitor dielectric, thus increasing signal retention time.

16 Claims, 11 Drawing Sheets

TRENCH CAPACITOR WITH AN INTRINSICALLY BALANCED FIELD ACROSS THE DIELECTRIC

BACKGROUND OF THE INVENTION

1. Technical Field

This invention generally relates to integrated circuit capacitors, and more specifically relates to deep trench capacitors.

2. Background Art

The need to remain cost and performance competitive in the production of semiconductor devices has caused continually increasing device density in integrated circuits. To facilitate the increase in device density, new technologies are constantly needed to allow the feature size of these semiconductor devices to be reduced.

The push for ever increasing device densities is particularly strong in Dynamic Random Access Memory (DRAM) markets. One particular area of concern in DRAM design is the storage capacitor used to store each memory cell. The density of DRAM designs is to a great extent limited to by the feature size of the storage capacitor.

The charge stored in the storage capacitor is subject to current leakage and for that reason the DRAM must be refreshed periodically. The time allowed between refresh without excess charge leakage is the data retention time, which is determined by the amount of charge stored at the beginning of the storage cycle and the amount of leakage current through different kinds of leakage mechanisms. For various reasons it is often preferable to minimize the leakage mechanisms so as to extend the time allowed between refresh cycles.

Several methods have been used to facilitate the shrinkage of the capacitor feature size while maintaining sufficient capacitance. For example, stacked capacitors have been located above the transfer devices. Unfortunately, this approach presents difficulties with topography and with connecting the capacitors.

Another approach has been the use of trench capacitors as storage capacitors. Trench capacitors extend the storage node into the substrate to increase the capacitance without increasing the area used on the substrate. The trench capacitor design typically uses a highly conductive single crystal silicon substrate as the counter electrode, and a highly conductive polycrystalline silicon in a deep trench as the storage electrode of the capacitor. By extending the capacitor in the vertical dimension trench capacitors allow the capacitor feature size to be decreased without decreasing the resulting capacitance The trench capacitor was further refined by the use of a substrate plate trench design. Referring to FIG. 11, there is shown a schematic cross-sectional view of the basic buried plate trench DRAM cell. The cell includes a substrate 10 of P type semiconductor. A P well 12 is formed above an N-well 30. At the upper surface of the P well 12 a transfer device 14 is formed that includes a control gate 16 that is responsive to a word access line of the DRAM array support circuits, not shown. The transfer device 14 couples data between bit line diffused $N^+$ region 18 and diffused $N^+$ region 20 through the channel region formed in P well 12. A deep trench 22 is formed into the substrate 10. Surrounding the deep trench 22 is formed a buried plate 23 that serves as the capacitor counter electrode, and is connected to the buried plates of other cells through N-well 30. Inside deep trench 22 is formed the capacitor storage node comprising $N^+$ type polysilicon electrode 24 isolated from substrate 10 by a thin dielectric layer. $N^+$ region 20 and the polysilicon storage node 24 are connected by a buried strap 11. At the top of the storage trench 22 is a thick isolating collar 28 which serves to prevent vertical leakage. STI region 13 serves to isolate this cell from others in the array.

Unfortunately, the quest for ever decreasing device size has already begun to squeeze the traditional deep trench design. Typically, as the size of the deep trench capacitor is decreased, the effective thickness of the node dielectric must be aggressively reduced in order to maintain reasonable trench storage capacitance. Since array voltages are scaled at a slower rate than the minimum feature size, the maximum electric field seen in the capacitor dielectric has become a significant reliability concern.

Consider a trench capacitor formed with a N+ poly storage node and an N+ buried plate. In these capacitors, to help minimize the maximum electric field in the capacitor dielectric, some contemporary designs utilize a buried plate which is biased at the midpoint between the bit line low ("0") and the bit line high ("1") levels. This balances the capacitor voltage swing and thus minimizes the maximum electric field seen in the dielectric and minimizes leakage through the dielectric. For example, where the capacitor storage node swings between 1.5 volts for a high level, and 0 volts for a low level, the buried plate would be biased at 0.75 volts. This balancing technique reduces the maximum voltage across the node dielectric to one-half of the bit line swing. In the above example, the maximum voltage across the capacitor (from storage node to buried plate) is limited to ±0.75 volts, where a unbiased plate would have resulted in a maximum voltage of 1.5 volts. Unfortunately, this technique adds significant complexity to the design in that a charge pump and voltage distribution system is required to effectively bias the buried plate. This technique also has the disadvantage of increasing power consumption due to increased leakage current from the biased buried plate to the substrate. This technique also has the disadvantage of coupling noise from the bias circuitry to the capacitor.

Thus, there are needed improved memory capacitor designs that minimize the amount of voltage across the dielectric while maintaining device simplicity and minimizing power consumption.

DISCLOSURE OF THE INVENTION

The preferred embodiment of the present invention provides an improved capacitor design that overcomes many of the limitations of the prior art. In particular, the preferred embodiment uses germanium in the storage node to intrinsically balance the electric fields seen in the capacitor dielectric, thus minimizing the maximum electric field. The difference in electric potential seen across the capacitor is the difference between the storage node conduction band potential and the counter electrode conduction band potential. The preferred embodiment of the present invention uses germanium to adjust the work function of the storage node. Specifically, the addition of germanium modifies the fermi level of the storage node, moving the fermi level towards the vacuum level. This modification of the fermi level reduces the difference in conduction band potentials between the storage node and the counter electrode, thus reducing the maximum electric potential seen across the capacitor.

In the preferred embodiment, p-type doped silicon germanium is formed in the trench capacitor adjacent to the capacitor dielectric layer. A barrier layer is then formed over the doped silicon germanium, and the remaining storage node area is filled with n+-type polysilicon. The p-type doped silicon germanium adjusts the workfunction of the capacitor storage node, moving the fermi level toward the vacuum level. This minimizes the maximum difference between conduction potentials of the storage node and the buried plate, which serves as the counter electrode. This has the effect of intrinsically balancing the electric potential seen across the dielectric for stored high and stored low situations, and thus reduces the maximum electric potential seen across the capacitor dielectric. This solution improves the reliability of the capacitor, especially those capacitors with relatively thin dielectric layers, without requiring additional circuitry to bias the buried plate, and without increasing power consumption. The preferred embodiment also reduces leakage current through the capacitor dielectric, thus increasing signal retention time.

The foregoing and other features and advantages of the present invention will be apparent from the following more particular description of the preferred embodiment of the invention, as illustrated in the accompanying drawings.

BEST MODE FOR CARRYING OUT THE INVENTION

As discussed above, the preferred embodiment of the present invention relates to trench capacitors, and the use of workfunction adjustment to balance intrinsically balance the electric field in the dielectric. Individuals skilled in the art of capacitors, fermi levels and band gap diagrams may wish to proceed to the Detailed Description section of this specification. However, those individuals who are new to capacitor technology, or new fermi levels and band gap diagrams, should read this overview section in order to best understand the benefits and advantages of the present invention.
1. Overview

Energy Band Gap Diagrams

Semiconductors are the basis of so much of our modern electronic technology because the electric current flowing through them can be controlled with modest amounts of energy. This is due to the presence of a "gap" between the valence (nonconducting) band and the conduction (conducting) band of the semiconductor material. "Bandgap" diagrams are used to illustrate the energy level differences for various materials. For more information on bandgap diagrams see "Fundamentals of Modem VLSI Devices" Y. Taur & T. H. Ning, Cambridge University Press 1998.

Figure 1:
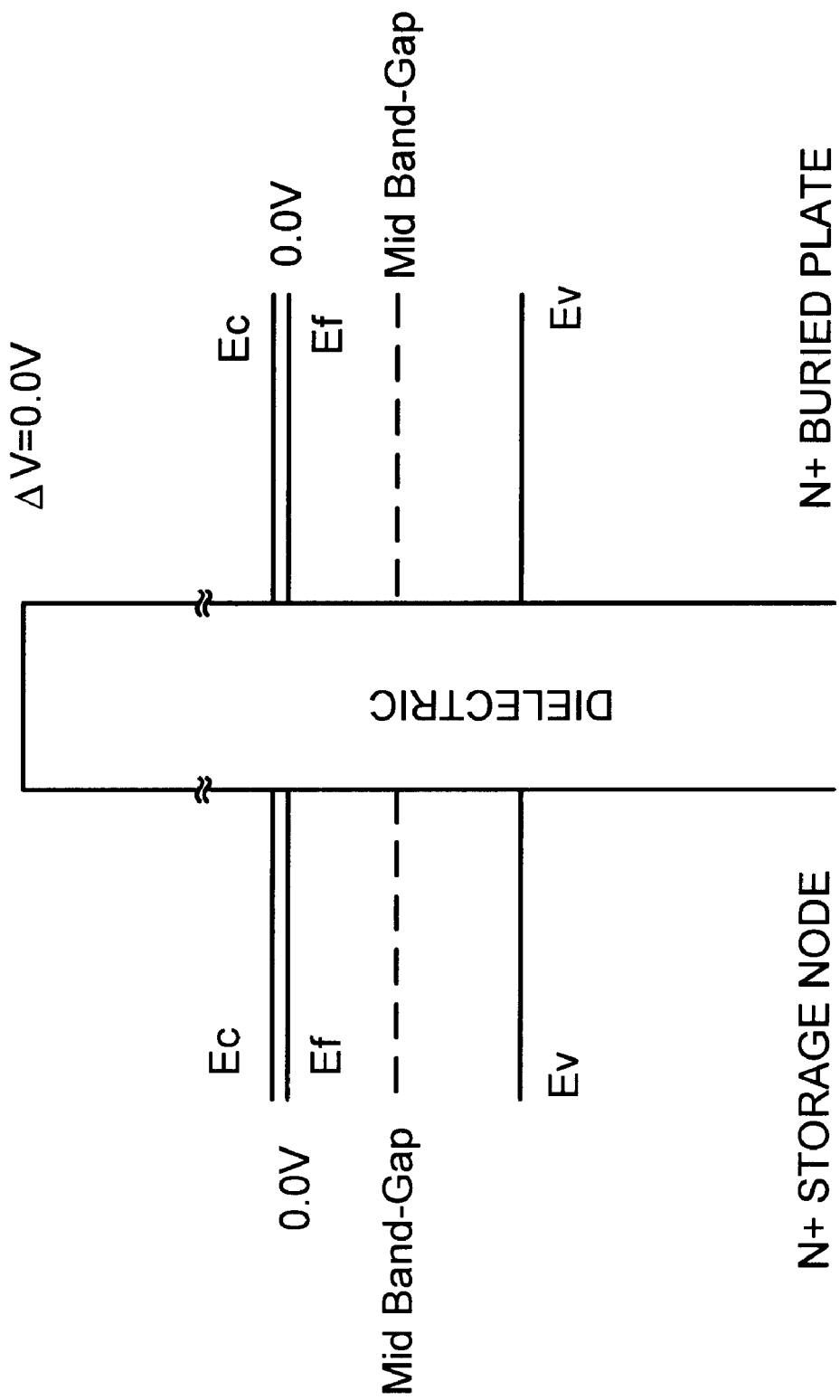
FIGS. 1 and 2 are band-gap diagrams illustrated for a conventional deep trench capacitor.
Figure 2:
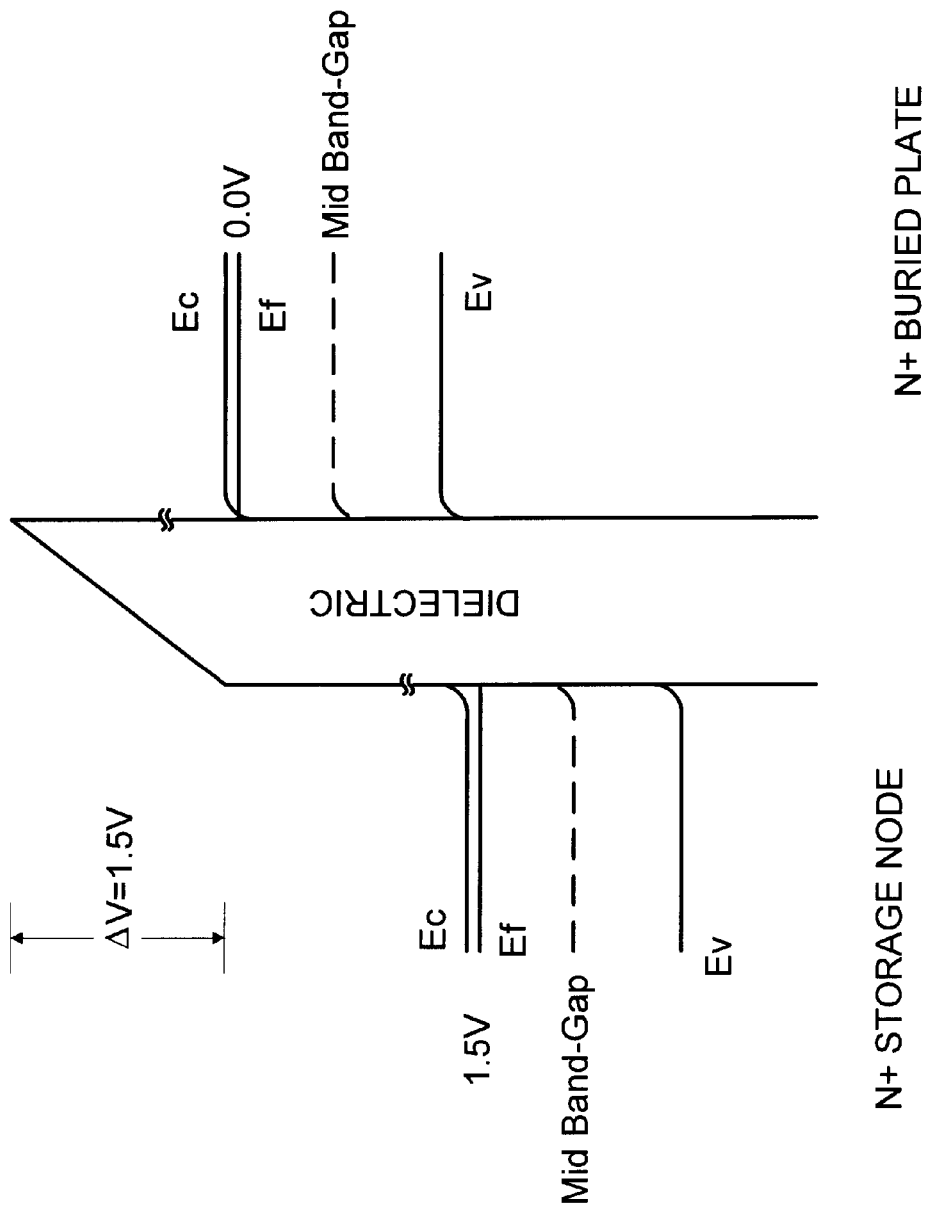

Turning now to FIGS. 1 and 2, band-gap diagrams are illustrated for a conventional deep trench capacitor. In this example, both the storage node and the buried plate counter electrode are heavily n-type doped. In this example, plate biasing is not used to balance the electric fields. FIG. 1 show the energy band diagrams with the storage node at 0.0V ("0"), while FIG. 2 shows the and 1.5V ("1") respectively. FIGS. 1 and 2 illustrate the conduction band edge (Ec), the valance band edge (Ev) and the Fermi level (Ef) of both the storage node and the buried plate. Also illustrated are the mid band-gap levels for the storage node and the buried plate.

In this case, the lack of plate biasing results in electric fields that are significantly out of balance, and thus are not minimized. Specifically, FIG. 1 shows that the ΔV seen across the capacitor dielectric for a stored "0" is 0.0 volts (with the difference being equal to the difference in conduction band edge levels). Conversely, FIG. 2 shows that the ΔV seen across the capacitor dielectric for a stored "1" is 1.5 volts. Thus, the unbiased design results in the full 1.5 volts being seen across the capacitor dielectric. As discussed above, this can result in significant degradation of dielectric reliability, and increased leakage through the dielectric.

Figure 3:
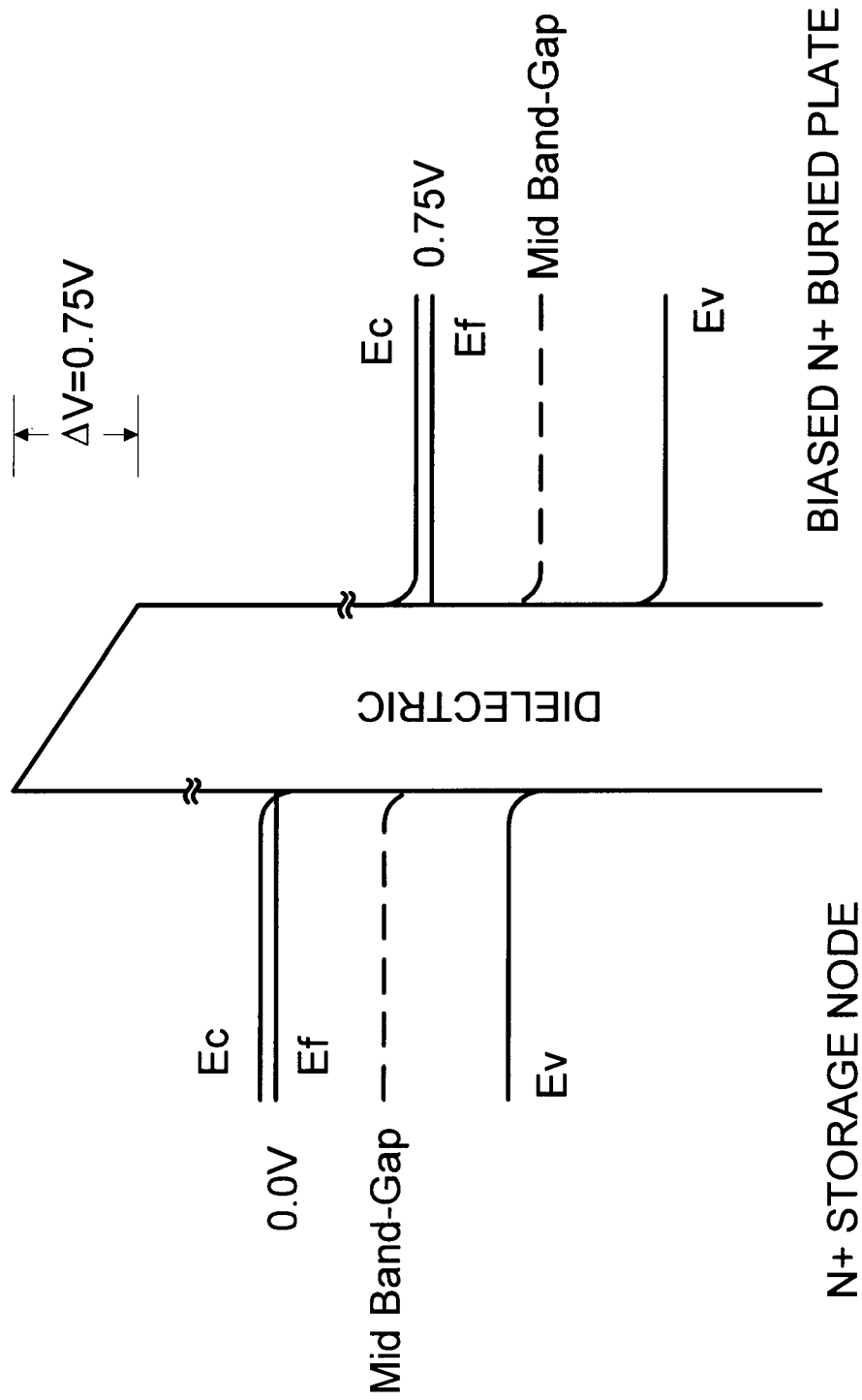
FIGS. 3 and 4 are band-gap diagrams illustrated for a conventional deep trench capacitor with external biasing.
Figure 4:
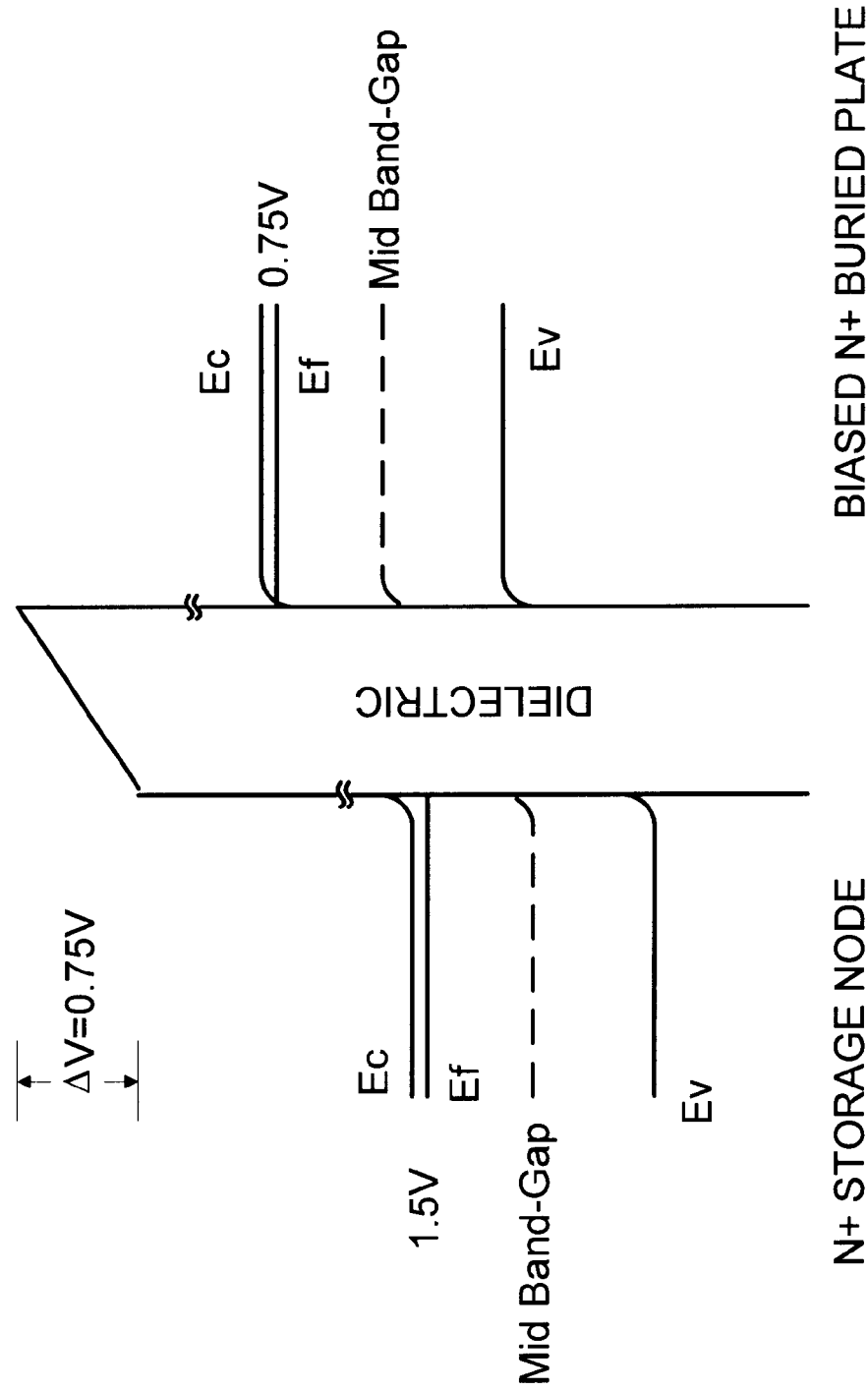

Turning now to FIGS. 3 and 4, band diagrams are illustrated for a conventional deep trench capacitor that uses plate biasing to balance electric fields across the capacitor. In this example, both the storage node and the buried plate counter electrode are heavily n-type doped. The buried plate is biased at Vdd/2, or 0.75 volts. FIG. 3 show the energy band diagrams with the storage node at 0.0V ("0"), while FIG. 4 shows the and 1.5V ("1") respectively.

In this case, biasing the plate balances the electric field across the capacitor such that ΔV seen across the capacitor for both "0"and "1"storage situations is 0.75 volts. With the maximum voltage seen across the capacitor limited to 0.75 volts, the reliability of the dielectric is significantly improved. However, as discussed above, this technique adds significant complexity to the design in that a charge pump and voltage distribution system is required to effectively bias the buried plate. This technique also has the disadvantage of increasing power consumption due to increased leakage current from the biased buried plate to the substrate. This technique also has the disadvantage of coupling noise from the bias circuitry to the capacitor.
2. Detailed Description The preferred embodiment of the present invention provides an improved capacitor design that overcomes many of the limitations of the prior art. In particular, the preferred embodiment uses germanium in the storage node to minimize the maximum electric potential that is seen across the capacitor dielectric. The difference in electric potential seen across the capacitor is the difference between the storage node conduction band potential and the counter electrode conduction band potential. The preferred embodiment of the present invention uses germanium to adjust the work function of the storage node. Specifically, the addition of germanium modifies the fermi level of the storage node, moving the fermi level towards the vacuum level. This modification of the fermi level reduces the difference in conduction band potentials between the storage node and the counter electrode, thus reducing the maximum electric potential seen across the capacitor.

In the preferred embodiment, p-type doped silicon germanium is formed in the trench capacitor adjacent to the capacitor dielectric layer. A barrier layer is then formed over the doped silicon germanium, and the remaining storage node area is filled with n+-type polysilicon. The p-type doped silicon germanium adjusts the workfunction of the capacitor storage node, moving the fermi level toward the vacuum level. This minimizes the maximum difference between conduction band-edge potentials of the storage node and the buried plate, which serves as the counter electrode. This has the effect of balancing the electric potential seen across the dielectric for stored high and stored low situations. This reduces the maximum electric potential seen across the capacitor dielectric. This solution improves the reliability of the capacitor, especially those capacitors with relatively thin dielectric layers, without requiring additional circuitry to bias the buried plate, and without increasing power consumption. The preferred embodiment also reduces leakage current through the capacitor dielectric, thus increasing signal retention time.

In the preferred embodiment of the present invention, sufficient germanium is introduced to the boron doped polysilicon of the storage node to shift the workfunction approximately one third of a Si band gap for a stored "1". In general, the desired shift in the workfunction, $\Delta WF$, of the P+ doped silicon/germanium approximately equals:

$$\Delta WF \sim BandGap-(V"1"-V"0")/2$$

Figure 5:
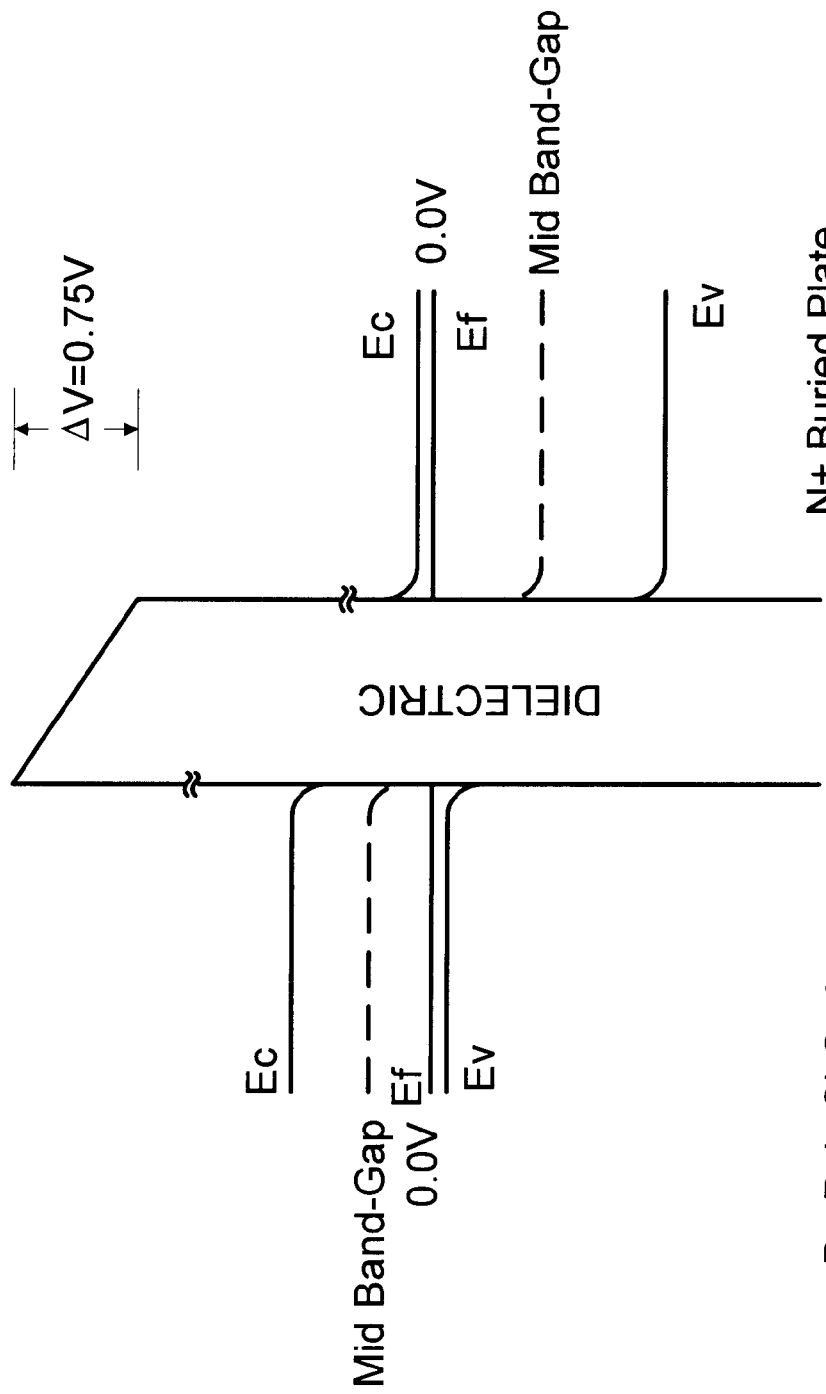
FIGS. 5 and 6 are band-gap diagrams illustrated for a deep trench capacitor having a silicon/germanium layer in accordance with the preferred embodiment of the present invention.
Figure 6:
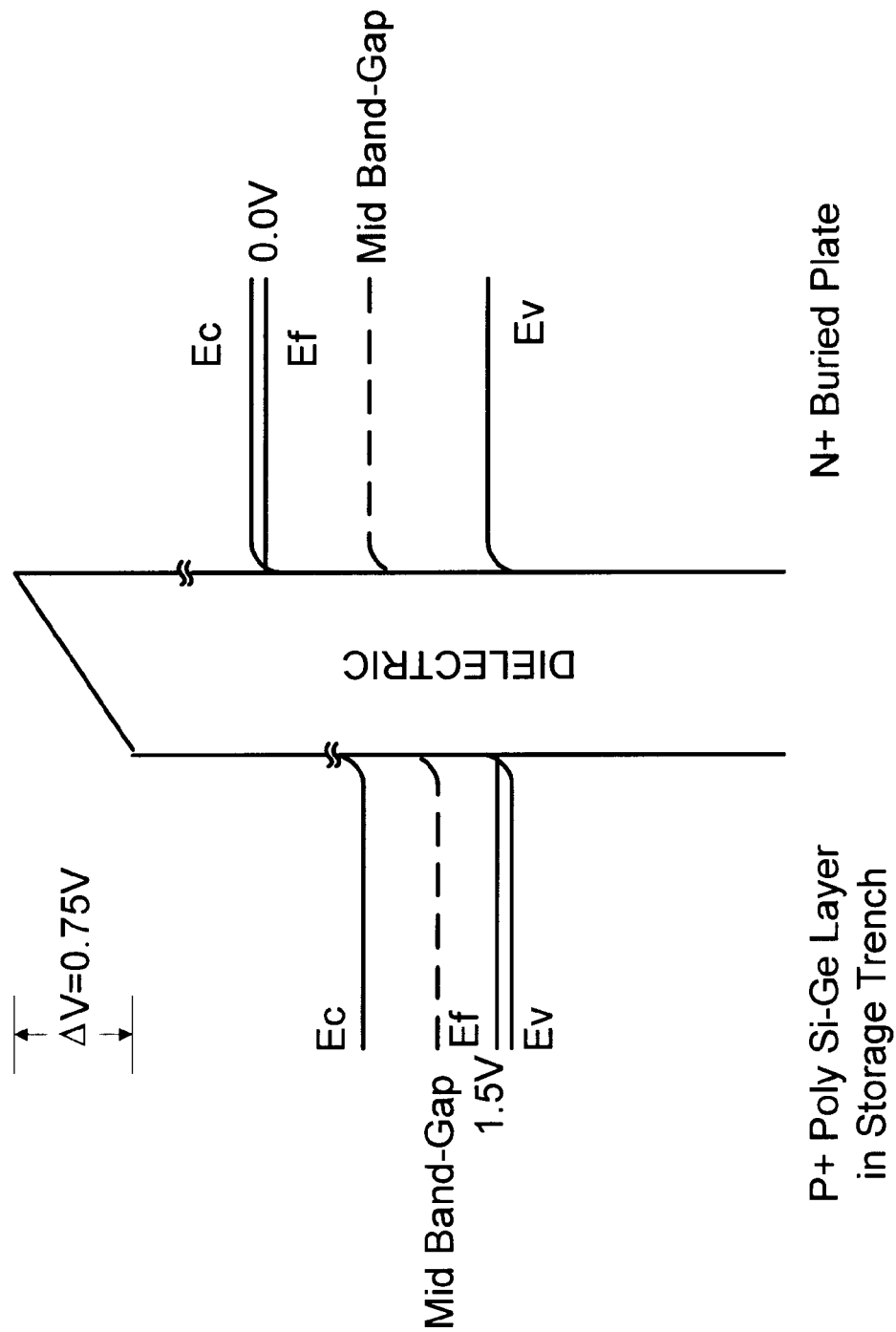

In the preferred embodiment, BandGap is the band-gap of silicon, or approximately 1.1.V, and V"1" is the voltage stored for a "1", and V"0" is the voltage for a "0". For example, in a system that uses 1.5 volts at the storage node to indicate a "1", a workfunction shift of 0.35 volts would be preferable. Typically, a 0.35 volt shift can be achieved with approximately 50–65 percent germanium in the silicon/germanium layer. Turning now to FIGS. 5 and 6, band diagram are illustrated for an intrinsically balanced deep trench capacitor with according to the preferred embodiment of the present invention. In this example, p-type doped silicon germanium is formed in the trench capacitor adjacent to the capacitor dielectric layer sufficient to shift the workfunction of the storage layer 0.35 volts towards mid the vacuum level. A barrier layer is then formed over the doped silicon germanium, and the remaining storage node area is filled with n+-type polysilicon. This results in an intrinsically balanced capacitor design. FIG. 5 shows the energy band diagrams with the storage node storing a "0" value, while FIG. 6 shows the energy band diagrams with the storage node storing a "1".

In the preferred embodiment, the workfunction shift results an intrinsically balanced capacitor design that $\Delta V$ seen across the capacitor for both "0" and "1" storage situations is approximately 0.75 volts. With the maximum voltage seen across the capacitor is ideally limited to 0.75 volts, the reliability of the dielectric is significantly improved. Additionally, this improvement is achieved without the significant complexity and noise coupling that a plate biasing system requires. This improvement also does not result in increased leakage current.

The preferred embodiment method for forming intrinsically balanced capacitors will now be discussed in detail. In the preferred embodiment, the method starts with traditional capacitor formation techniques. Starting with a silicon substrate, n-type band is formed in the in silicon substrate. A pad layer is then formed on the silicon substrate. A trench pattern is then etched into the pad, and then deep trenches are etched into the silicon using the pad as a mask. An oxide collar is then formed in the upper region of the trench using one of the many available techniques. An N+ buried plate is then formed as an out diffusion from the trench, with the oxide collar serving as a mask. Again, this can be done using any of the available techniques. A node dielectric layer is then formed in the bottom part of the capacitor trench, again using any available techniques.

With the capacitor begun as described above, a layer of P+ polysilicon doped with germanium is deposited in the capacitor. This layer of polysilicon/germanium will be used to adjust the workfunction of the storage node, as described above, resulting in an intrinsically balanced capacitor.

Figure 7:
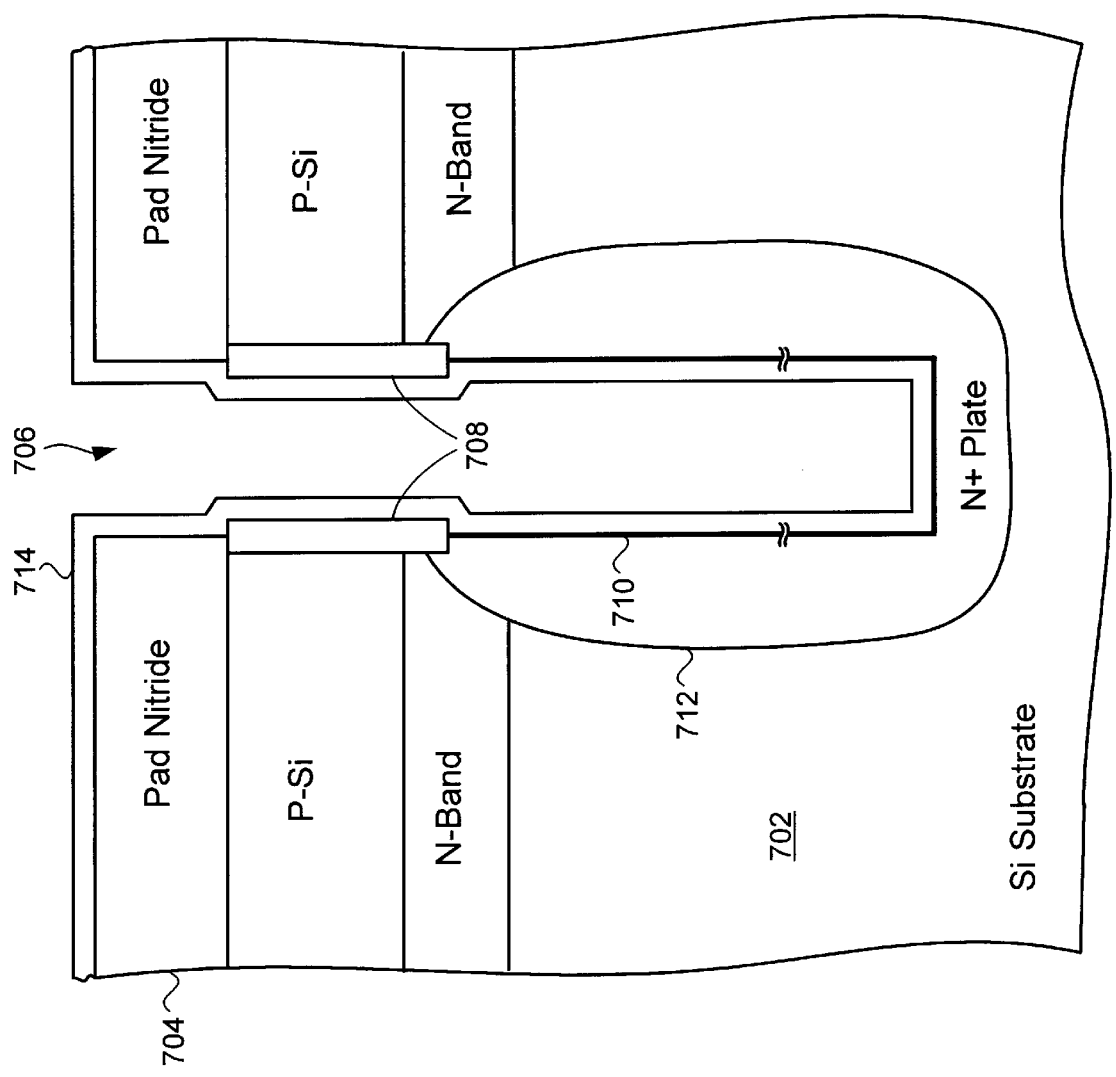
FIGS. 7–10 illustrate various process steps for forming a deep trench capacitor having a silicon/germanium layer in accordance with the preferred embodiment of the present invention.

Turning now to FIG. 7, an exemplary trench capacitor in accordance with the preferred embodiment is illustrated after the formation of the polysilicon/germanium layer. As stated above, the capacitor is preferably formed on a silicon substrate 702, where a nitride pad 704 has been formed and patterned to serve as a mask for etching the deep trench 706. Inside the deep trench are formed oxide collars 708 and capacitor dielectric 710. Surrounding the bottom of the deep trench is formed the N+ buried plate 712 which serves as the capacitor counter electrode. Also formed in the substrate 702 is the N band that serves the connect the buried plate 712 with the buried plates of other capacitors.

As described above, in accordance with the preferred embodiment, a P-type doped silicon/germanium layer 714 is formed in the capacitor trench. In the most preferred embodiment, the silicon/germanium layer 714 comprises a thin layer of heavily P-type doped polycrystalline $Si_{1-x}Ge_x$ is deposited, where x is the mole fraction of Ge. The mole fraction of Ge that is best for a particular design depends upon the details of the capacitor design. Typically, the workfunction of the capacitor is preferably adjusted by an amount which is approximately equal to one third of the silicon band gap for a stored high level "1" of 1.5 volts. For example, in a 1.5V capacitor, the workfunction of the storage node would be preferably adjusted ~0.35V. This adjustment would balance the maximum electric field as illustrated in FIGS. 5 and 6. A 0.35V adjustment would typically require a 10–30 nm $Si_{1-x}Ge_x$ layer with a mole fraction x of between 0.5 and 0.6. Of course, this amount will vary according the layer thickness and the amount of workfunction shift desired. More information on workfunction shifts can be found in the following publications: V. Li, et al "Single Gate 0.15 $\mu$m CMOS Devices Fabricated Using RTCVD In-Situ Boron Doped $Si_{1-x}Ge_x$ Gates," 1997 IEDM Tech. Digest, pp 833–836; Y Ponomarev, et al, "Gate-Workfunction Engineering Using Poly-(Si,Ge) for High-Performance 0.18 $\mu$m CMOS Technology," 1997 IEDM Tech. Digest, pp. 829–832; P Hellberg, et al, "Work Function of Boron-Doped Polycrystalline SixGel-x Films," IEEE EDL, Vol 18, No. 9, September 1997, pp. 456–458.

This germanium doped polysilicon can be formed in any suitable manner. For example, using a low pressure chemical vapor deposition (LPCVD) using SiH4 and GeH4 as reactants can be used a suitable process. Of course, other deposition processes with other reactants can be used where suitable. Preferably the deposition is performed at a temperature that will not disturb the thermal budget, e.g., preferably between 500 and 600° C.

It is preferable to degeneratively dope, or close to degeneratively dope the silicon germanium layer Boron is preferably used as a P-type dopant, to make polysilicon/germanium layer heavily P-type. Boron doping of the polysilicon/germanium can occur in situ with the formation of the silicon germanium, or as a separate processing step. For example, an in situ process of adding $B_2H_6$ during LPCVD can be used. Conversely, boron doping can be accomplished by gas phase or plasma doping following the LPCVD. Boron penetration through the node dielectric is typically not a problem due to the highly nitride composition of the capacitor dielectric, and also because the high concentration of N-type doping in the buried plate provides that any compensation by boron would be negligible.

With the layer of doped silicon/germanium deposited, the next step is to pattern this layer. This is preferably done by depositing a layer of photoresist and recessing the photoresist to a depth that is slightly above the bottom of the oxide collar. As will be illustrated more clearly later, the depth of recess directly determines the portion of the trench that is covered by the silicon/germanium layer. Again, this can be accomplished using any suitable process. It is most preferable to recess the photoresist to depth a which is less than the recess depth used in the formation of the oxide collar.

As stated above, the depth of recess directly determines the portion of the trench that is covered by the silicon/germanium layer. This amount of coverage determines the effect of the layer on the capacitor's parasitic transistor. To clarify, in most trench DRAM capacitor designs a parasitic MOSFET capacitor is formed from on the trench sidewall between the storage node diffusion and the buried plate. This parasitic transistor causes charge to leak from the storage capacitor, degrading retention time. By reducing the amount of recess depth, the portion of the trench covered with the silicon/germanium layer increases, the threshold voltage of the parasitic transistor is increased, reducing the leakage current of parasitic transistor. However, it is also not desirable to cover so much of the trench that formation of the N+ buried strap is affected. Thus, by using shallow recess to slightly above the bottom of the oxide collar, the threshold voltage of the vertical parasitic MOSFET is raised by 0.75V (relative to the N+ poly of prior capacitors), due to the workfunction of the P+ doped silicon/germanium layer.

Figure 8:
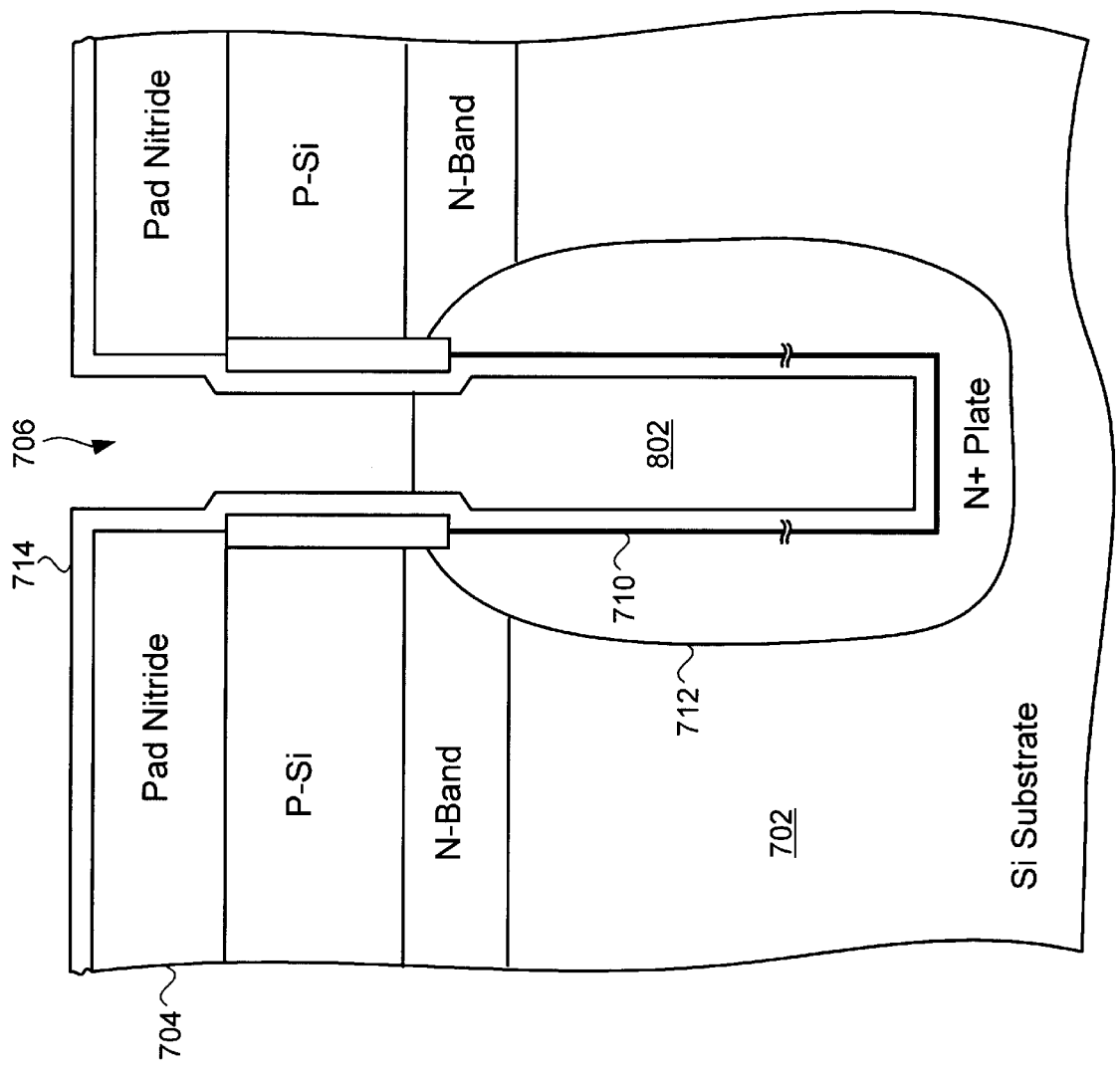

Turning now to FIG. 8, the substrate 702 is illustrated after the deposition and recessing of photoresist 802. Again, the photoresist 802 can be formed using any suitable method, such as a conformal deposition followed by a directional etch that leaves photoresist 802 only in the bottom of capacitor trench. As another example, a selective exposure to a selected depth can be used.

With the photoresist deposited and recessed into the trench, the photoresist will be used to protect the silicon/germanium layer at the bottom of the capacitor trench while the other areas of the silicon/germanium layer are removed. This is preferably done using an isotropic chemical dry etch (CDE) of chlorine chemistry that removes the exposed silicon/germanium layer. Again, this can be done using any suitable process. The remaining photoresist is then stripped using any suitable process while leaving the remaining silicon/germanium layer at the bottom portion of the capacitor trench.

Figure 9:
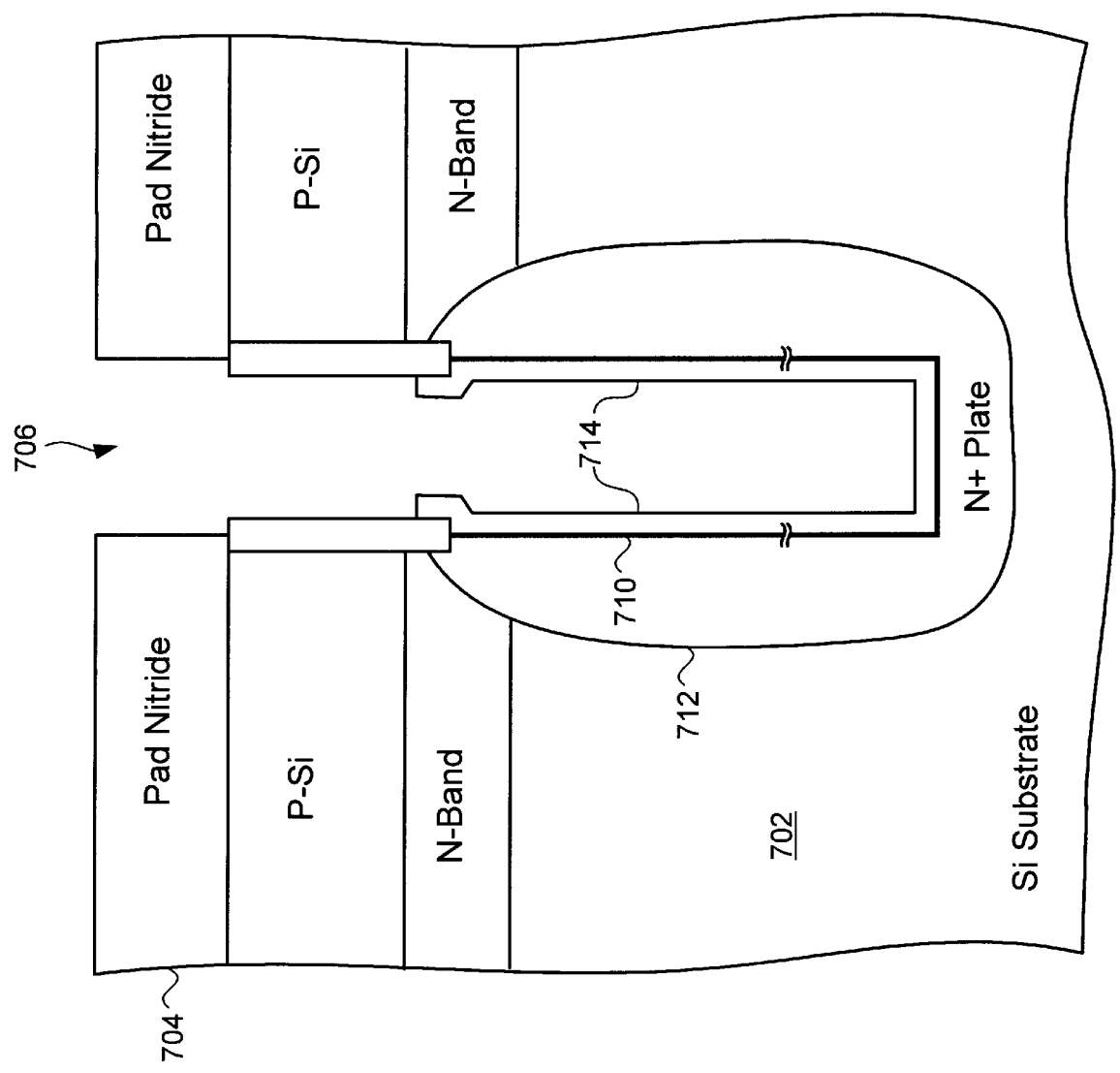

Turning now to FIG. 9, the exemplary silicon substrate 702 is illustrated after the patterning of the silicon/germanium layer 714, and the removal of the remaining photoresist 802. This leaves a silicon/germanium layer 714 in the bottom portion of the capacitor trench 706, but removes the silicon/germanium layer from all other portions of the device.

Following the removal of the photoresist, a diffusion barrier layer is formed over the remaining silicon/germanium. The diffusion barrier layer is formed to block interdiffusion between the P+ doped silicon/germanium layer and the subsequently deposited N+ polysilicon. In the preferred embodiment, the diffusion barrier layer is a deposited layer of titanium nitride (TiN) or tantalum silicon nitride (TaSiN) deposited using any suitable method. Typically, the diffusion barrier layer formed on the top horizontal surfaces would be removed by normal reactive ion etching processing steps that are done latter.

After the formation of the barrier layer, the storage node material is deposited to fill the capacitor trench, and the excess is removed. In the preferred embodiment, N+ polysilicon is deposited, filling the capacitor trench, using any suitable process. The N+ polysilicon is then removed from the top of the substrate using a planarization or other suitable removal process.

Figure 10:
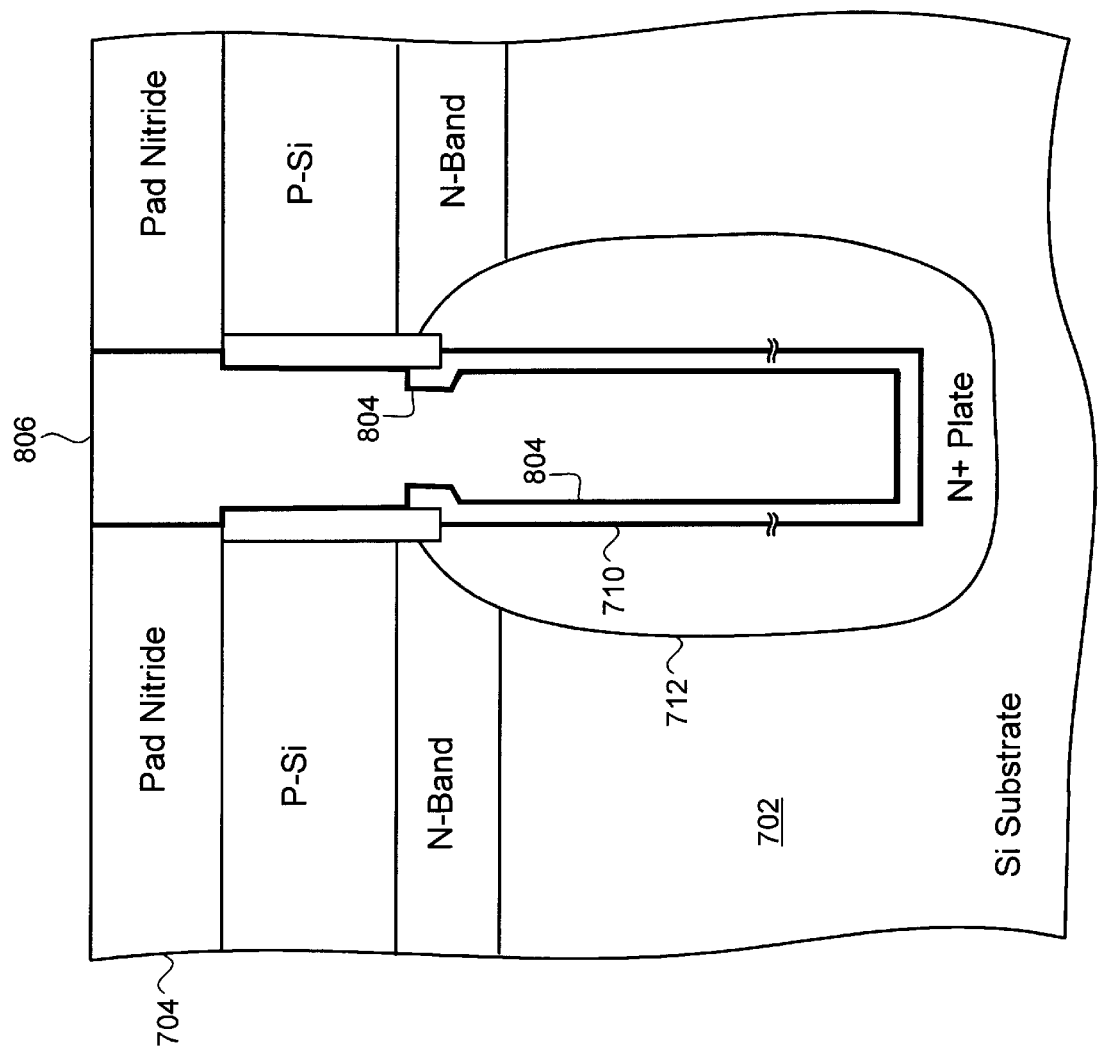
Figure 11:
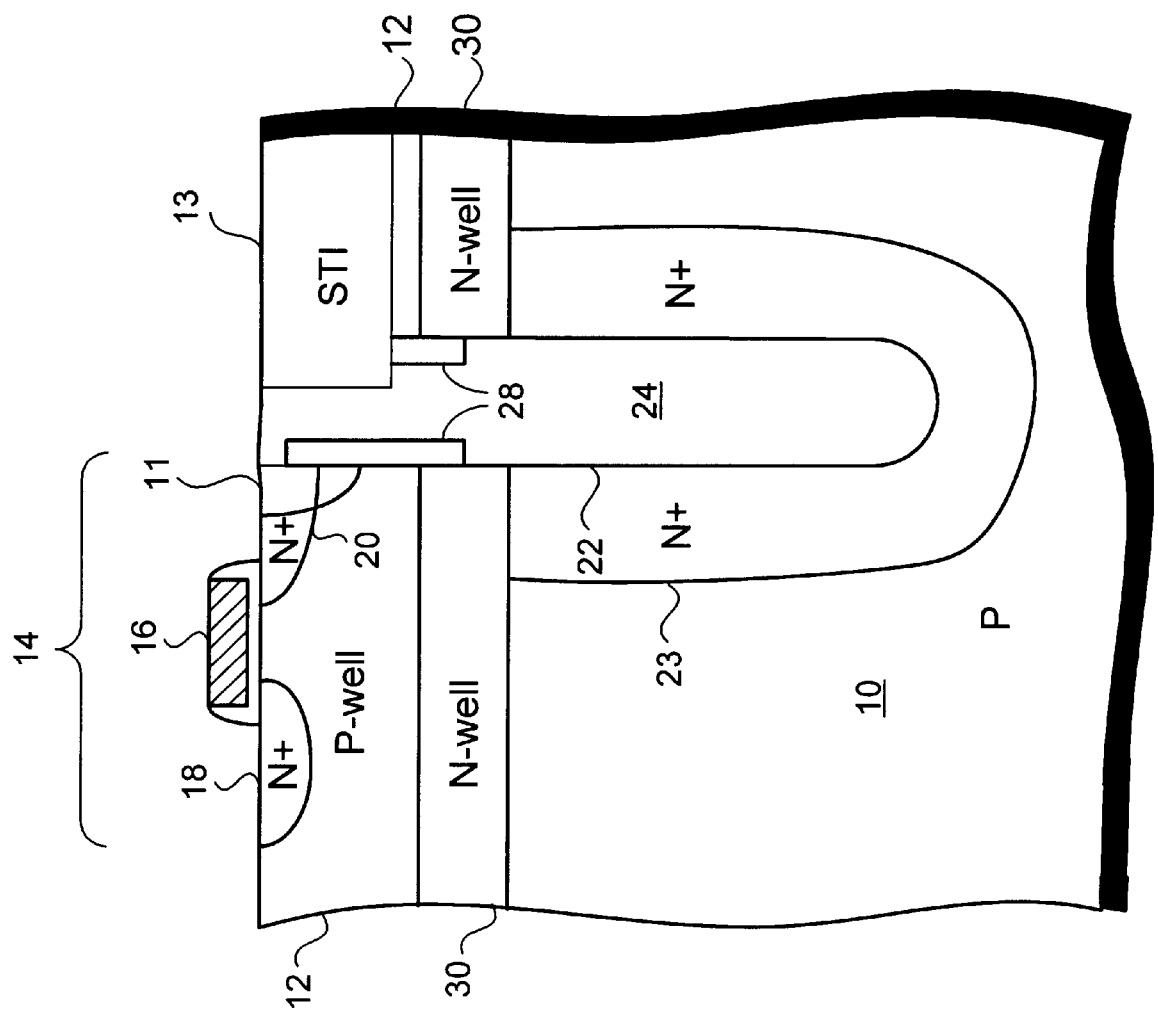
FIG. 11 illustrates a prior art deep trench capacitor.

Turning now to FIG. 10, the exemplary silicon substrate 702 is illustrated after the formation of a diffusion barrier 804 over the silicon/germanium 714 layer, and the deposition and planarization of the N+ storage node material 806. Again, the diffusion barrier 804 serves to block interdiffusion between the silicon/germanium layer 714 and the subsequently deposited N+ storage node material. The N+ storage node material provides the storage electrode for the capacitor. N+ material is preferable due to its compatibility with the N+ diffusions later formed as part of the access transistor for the capacitor.

After the formation of the N+ storage node material, the remaining process can be done using convention processing. This includes recessing the N+ storage node material, form a trench top insulator (TTO) on top of the recessed storage node material, form shallow trench isolation, buried traps and access transistors, etc.

It should be noted that this is just one example of how silicon/germanium can be used to intrinsically balance a capacitor. For example, instead of depositing a relatively thin layer of silicon germanium, the layer can fill the entire bottom portion of the trench, with the upper part then filled with the N+ storage node material.

This results in a capacitor design that is intrinsically balanced. In particular, the introduction of the P+ doped silicon/germanium layer adjusts the workfunction of the storage node. This balances the electric field seen across the capacitor dielectric and thus minimizes the maximum electric field, without requiring additional balancing circuitry.

The embodiments and examples set forth herein were presented in order to best explain the present invention and its practical application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed. Many modifications and variations are possible in light of the above teaching without departing from the spirit and scope of the forthcoming claims.

What is claimed is:

1. An integrated capacitor, the integrated capacitor comprising:
    a) a trench formed in a substrate;
    b) a counter electrode formed in the substrate surrounding the trench;
    c) a capacitor dielectric;
    d) a layer of silicon germanium formed in the trench; and
    e) a layer of silicon formed in the trench over the layer of silicon germanium, wherein the layer of silicon germanium is between the layer of silicon and the capacitor dielectric.

2. The capacitor of claim 1 wherein the silicon germanium layer comprises a layer of P-type doped $Si_{1-x}Ge_x$, where x comprises the mole fraction of Ge.

3. The capacitor of claim 2 wherein x comprises between 0.5 and 0.6.

4. The capacitor of claim 1 wherein the silicon germanium layer has a thickness between 10–30 nm.

5. The capacitor of claim 1 wherein the silicon layer formed in the trench comprises N-type doped polysilicon.

6. The capacitor of claim 1 wherein the silicon germanium layer substantially balances the electric field seen across the capacitor dielectric for high and low data storage.

7. The capacitor of claim 1 wherein the counter electrode comprises a N+ buried plate.

8. An intrinsically balanced integrated capacitor, the capacitor comprising:
   a) a trench formed in a substrate;
   b) a buried plate formed approximate the trench, the buried plate comprising a capacitor counter electrode;
   c) a capacitor dielectric formed in the trench;
   d) a storage electrode formed in the trench over the capacitor dielectric, the storage electrode comprising:
      i) a layer of $Si_{1-x}Ge_x$ formed adjacent to the capacitor dielectric, where x comprises the mole fraction of Ge;
      ii) a layer of doped polysilicon formed in the trench, the doped polysilicon covering the $Si_{1-x}Ge_x$ layer.

9. The capacitor of claim 8 wherein the buried plate comprises a N+ buried plate and wherein the layer of doped polysilicon comprises a N+ doped polysilicon.

10. The capacitor of claim 8 wherein x comprises between 0.5 and 0.6.

11. The capacitor of claim 8 wherein the layer of $Si_{1-x}Ge_x$ is doped P-type.

12. The capacitor of claim 8 wherein the $Si_{1-x}Ge_x$ layer has a thickness between 10–30 nm.

13. The capacitor of claim 8 wherein the $Si_{1-x}Ge_x$ fills the bottom portion of the trench.

14. The capacitor of claim 8 wherein the $Si_{1-x}Ge_x$ layer substantially balances the electric field seen across the capacitor dielectric for high and low data storage.

15. The capacitor of claim 8 further comprising an oxide collar formed around the top of the trench, and wherein the $Si_{1-x}Ge_x$ layer extends from the bottom of the trench to slightly above the bottom of the oxide collar.

16. The capacitor of claim 8, wherein the storage node further comprises barrier layer formed between the $Si_{1-x}Ge_x$ layer and the doped polysilicon.

* * * * *